United States Patent [19]

Wu et al.

[11] Patent Number: 5,262,198
[45] Date of Patent: Nov. 16, 1993

[54] METHOD OF PRODUCING A CARBON COATED CERAMIC MEMBRANE AND ASSOCIATED PRODUCT

[75] Inventors: Jeffrey C. S. Wu, Pittsburgh; George R. Gallaher, Oakmont Borough; Paul K. T. Liu, O'Hara Township, Allegheny County, all of Pa.

[73] Assignee: Aluminum Company of America, Pittsburgh, Pa.

[21] Appl. No.: 682,181

[22] Filed: Apr. 8, 1991

[51] Int. Cl.[5] .................. C23C 16/02; C23C 16/26; B01D 29/00
[52] U.S. Cl. .................. 427/249; 427/255; 427/255.1; 427/314; 427/372.2; 210/490; 210/500.26
[58] Field of Search .......... 427/249, 248.1, 255.1, 427/255, 314, 372.2; 210/490, 500.26

[56] References Cited

U.S. PATENT DOCUMENTS

| | | |
|---|---|---|
| 2,866,790 | 12/1958 | Pitzer . |
| 3,027,278 | 3/1962 | Reick .................. 117/226 |
| 3,260,679 | 7/1966 | O'Grady et al. . |
| 3,290,406 | 12/1966 | Pfefferie . |
| 3,294,832 | 12/1966 | Young et al. . |
| 3,360,134 | 12/1967 | Pullen . |
| 3,450,500 | 6/1969 | Setzer et al. . |
| 3,854,979 | 12/1974 | Rossi . |
| 3,904,552 | 9/1975 | O'Hara . |
| 4,143,083 | 3/1979 | Riesser . |
| 4,152,300 | 5/1979 | Riesser . |
| 4,268,278 | 5/1981 | Dobo et al. . |
| 4,313,013 | 1/1982 | Harris .................. 585/818 |
| 4,467,046 | 8/1984 | Smith et al. . |
| 4,482,360 | 11/1984 | Taketomo et al. . |
| 4,548,619 | 10/1985 | Staecy . |
| 4,636,434 | 1/1987 | Okamura et al. . |
| 4,684,619 | 4/1987 | Moore . |
| 4,758,543 | 7/1988 | Sherrod et al. . |
| 4,791,079 | 12/1988 | Hazbun . |
| 4,865,739 | 9/1989 | Bauer et al. .................. 210/490 |
| 4,946,592 | 8/1990 | Galaj et al. . |
| 5,100,523 | 3/1992 | Helms et al. .................. 204/290 R |

FOREIGN PATENT DOCUMENTS 1204353 9/1970 United Kingdom .
2201159 8/1988 United Kingdom .

OTHER PUBLICATIONS

Colin et al., "Modified Carbon Black In High-Performance Liquid Chromatography", *Journal of Chromatography*, 119, pp. 41-54 (1976).

Colin and Guiochon, "Development and Use of Carbon Adsorbents In High-Performance Liquid-Solid Chromatography", *Journal of Chromatography*, 126, pp. 43-62 (1976).

Takahashi et al., "The Role of Hydrogen-Carbon Ratio of Coke in Cracking of Aromaric Hydrocarbons on Silica-Alumina Catalyst", *J. Japan Petrol. Inst.*, 21, (2), pp. 85-88 (1978).

Lyons et al., "Thin Pinhole-Free Carbon Films", *Thin Solid Films*, 103, pp. 333-341 (1983).

Butterworth and Scaroni, "Carbon-Coated Alumina As A Catalyst Support", *Applied Catalysis*, 16, pp. 375-388 (1985).

Liu et al., "Electrochemical Synthesis of Ultrathin-Film Composite Membranes", *J. Am. Chem. Soc.*, 112, pp. 2458-2459 (1990).

Trimm, "Poisoning of Metallic Catalysts", *Chem. Ind.* (Dekker), 20 (Deactivation Poisoning Catal.) pp. 151-184 (1985).

*Primary Examiner*—Michael Lusignan
*Assistant Examiner*—Bret Chen
*Attorney, Agent, or Firm*—David V. Radack; William J. O'Rourke, Jr.

[57] ABSTRACT

A method of producing a carbon coated ceramic membrane including passing a selected hydrocarbon vapor through a ceramic membrane and controlling ceramic membrane exposure temperature and ceramic membrane exposure time. The method produces a carbon coated ceramic membrane of reduced pore size and modified surface properties having increased chemical, thermal and hydrothermal stability over an uncoated ceramic membrane.

17 Claims, 5 Drawing Sheets

METHOD OF PRODUCING A CARBON COATED CERAMIC MEMBRANE AND ASSOCIATED PRODUCT

The government of the United States of America has rights in this invention pursuant to Contract No. DE-FC07-88ID12778 awarded by the United States Department of Energy.

BACKGROUND OF THE INVENTION

1. Field of the Invention

This invention relates to a method of producing a carbon coated membrane and the resulting product and more particularly to a carbon coated ceramic membrane of reduced pore size and modified surface properties having increased chemical, thermal and hydrothermal stability over an uncoated ceramic membrane.

2. Background of the Invention

Ceramic membranes have a variety of uses in industry. They are widely used for separating processes and more particularly microfiltration and ultrafiltration. Ceramic membranes are also potentially useful in high temperature catalytic reaction processes with hydrocarbon streams, such as the dehydrogenation of ethylbenzene to styrene.

One type of ceramic membrane consists of a multilayer, asymmetric structure with layers of alpha alumina of varying pore size deposited on an alpha alumina support. A final top layer of gamma alumina is deposited on these alpha alumina layers. As is known, the gamma alumina is a transitional alumina and will undergo a phase transformation at elevated temperatures to the more thermodynamically stable alpha form. This transformation is accelerated by the presence of water. This transformation is undesired because the alpha alumina has a lower surface area resulting in a larger pore size. As the transformation takes place, pore size grows and separation efficiency drops.

U.S. Pat. No. 4,865,739 discloses a carbon-coated membrane and process for producing the same. The process consists of depositing at least one layer of a stable emulsion of mineral particles in a solution containing a cokable thermosetting resin. That resin undergoes a polycondensation treatment, followed by coking. The coke formed ensures both the mechanical connection of the mineral particles to one another and to the support.

Butterworth et al., "Carbon-Coated Alumina As A Catalyst Support", *Applied Catalysis*, 16 pages 375-388 (1985) discloses carbon deposition on a gamma alumina support by liquid-phase carbonization of anthracene or the vapor-phase pyrolysis of propylene. This article is concerned only with alumina powder.

There is still a need for a method of efficiently and effectively producing a carbon coated ceramic membrane having the desired properties of reduced pore size and chemical, thermal and hydrothermal stability.

SUMMARY OF THE INVENTION

The method of producing a carbon coated ceramic membrane includes passing a selected hydrocarbon vapor through the ceramic membrane and controlling ceramic membrane exposure temperature and ceramic membrane exposure time. The method produces a carbon coated ceramic membrane of reduced pore size and modified surface properties having increased chemical, thermal and hydrothermal stability over an uncoated ceramic membrane.

It is an object of the invention to provide a method for producing a carbon coated ceramic membrane in an efficient and effective manner.

It is a further object of the invention to provide a ceramic membrane having a reduced pore diameter by virtue of carbon coating.

It is a further object of the invention to provide a ceramic membrane having modified surface properties.

It is a further object of the invention to provide a ceramic membrane which is chemically stable.

It is a further object of the invention to provide a ceramic membrane which is thermally stable.

It is a further object of the invention to provide a ceramic membrane with improved hydrothermal stability.

It is a further object of the invention to provide a carbon coating which slows the phase transformation of transitional aluminas to the more thermodynamically stable alpha alumina form.

These and other objects of the invention will be fully understood from the following description of the invention with reference to the drawings appended to this application.

DESCRIPTION OF THE PREFERRED EMBODIMENTS

Method Of The Invention

Figure 1:
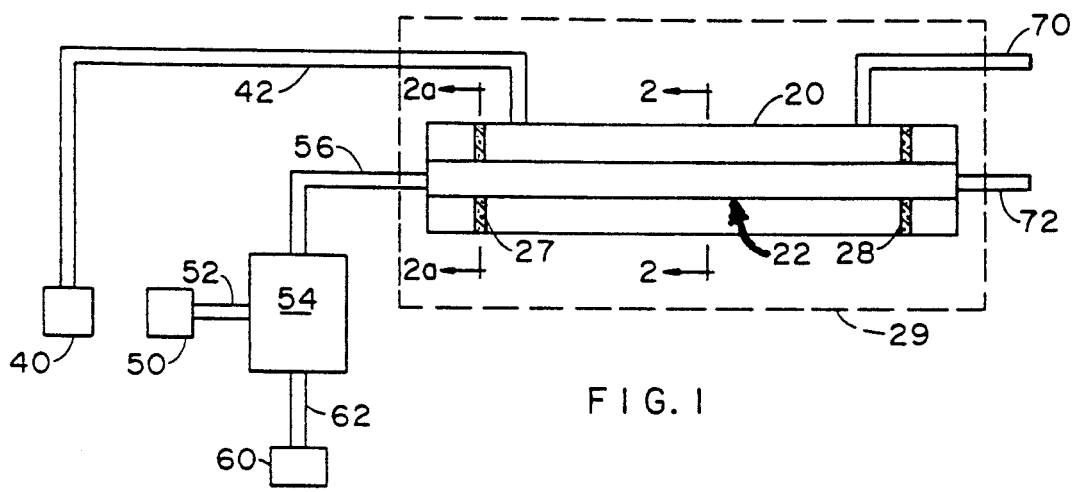
FIG. 1 is a partially schematic view showing the apparatus used to produce the carbon coated membrane of the invention.
Figure 2:
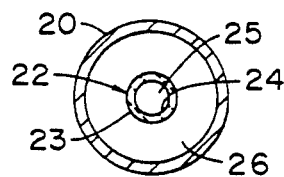
FIG. 2 is a cross-sectional view of the tube containing the membrane to be coated taken along line 2—2 of FIG. 1.
Figure 2A:
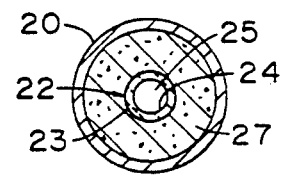
FIG. 2a is a cross-sectional view of the tube containing the membrane to be coated and the graphite seal taken along line 2a-2a of FIG. 1.

Referring now more particularly to FIGS. 1, 2 and 2a, the method of the invention will be described in detail. A vessel 20 made of stainless steel has mounted inside of it an uncoated, elongated ceramic membrane 22 in the form of a tube as seen in one aspect in FIGS. 2 and 2a. It will be appreciated that the ceramic membrane 22 is not limited to the form shown in FIGS. 1, 2 and 2a. The ceramic membrane can be in the form of a flat disc, a multi-channel monolith and a wound spiral.

As can be seen in FIGS. 2 and 2a, the ceramic membrane 22 has an outside surface 23 and an inside surface 24. The inside surface 24 defines a hollow interior space 25 which is known as the "tube side". The vessel 20 and the outside surface 23 define an annular outer space 26 which is known as the "vessel side". As can be seen in FIGS. 1 and 2a, the vessel side is provided with two spaced apart annular graphite seals 27 and 28. The purpose of these graphite seals 27 and 28 will be explained further below. The vessel 20 containing the ceramic membrane 22 is placed into a furnace 29, which is shown schematically in FIG. 1.

After placing the vessel 20 containing the ceramic membrane 22 and graphite seals 27 and 28 into the furnace 29, a flow of an inert purge gas which is typically nitrogen but which can also be helium is supplied from source 40 to line 42 into the vessel side between the graphite seals 27 and 28. The flow rate of this purge gas can be up to one liter per minute and the purge gas is supplied at room temperature. After the flow of purge gas in initiated, the electric furnace 29 is heated so as to raise the temperature of the ceramic membrane 22 to about 575° C. to 675° C. with 630° C. to 650° C. being preferred and 640° C. being most preferred. The purge gas is supplied throughout the process (i) to provide a purge so that any desorbed gases or vapors on the ceramic membrane 22 are swept away and (ii) to facilitate even distribution of heat throughout the ceramic membrane 22 during heating of the furnace 29 and the ceramic membrane 22.

The next step in the process is that a nitrogen gas flow is established in the tube side of ceramic membrane 22. Nitrogen gas is supplied from nitrogen gas source 50 through line 52 and into vaporizer 54. The nitrogen gas is vaporized in the vaporizer 54 and is carried by line 56 into the tube side of the ceramic membrane 22. This is a pretreating step which modifies the surface chemistry and composition of the ceramic membrane 22 to promote the carbon deposition. This pretreating step also modifies the acidity of the ceramic membrane 22. While this pretreating step is occurring, the nitrogen purge gas from line 42 is continued to be flowed into the vessel side. The pretreating step is carried out at a ceramic membrane temperature of about 400° C. to about the ceramic membrane exposure temperature which is discussed below.

The carbon coating of the ceramic membrane 22 is now ready to begin. Referring particularly to FIG. 1, ethylbenzene from an ethylbenzene source 60 is flowed into the vaporizer 54 through line 62. The vaporizer 54 vaporizes the ethylbenzene and the vaporized ethylbenzene is entrained with the vaporized nitrogen gas through line 56. The vaporized ethylbenzene/nitrogen gas flow is introduced into the tube side of ceramic membrane 22.

The ceramic membrane 22 is exposed to the vaporized ethylbenzene/nitrogen gas flow for about 1 to 5 hours with about 3½ to 4½ hours being preferred. The ceramic membrane 22 is maintained at a temperature of about 575° C. to 675° C. with about 630° C. to 650° C. being preferred.

Because of the porosity of the ceramic membrane 22, a portion of the organic permeates through the ceramic membrane 22 and we found that the ceramic membrane 22 was coated with a carbon coating. A portion of the permeating organic reacts with the heated alumina surface to form carbon deposits. The permeation insures carbon deposition throughout the structure of the ceramic membrane 22. Another portion of the organic permeates through the ceramic membrane 22 and does not react with the materials of the ceramic membrane 22. This unreacted organic is swept away by the inert purge gas flow from source 40 and line 42 and out permeate exit line 70. The graphite seals 27 and 28 resist entry of the unreacted organic back into the tube side of the ceramic membrane 22.

Yet another portion of the organic remains on the tube side of the ceramic membrane 22 and is swept out through reject exit line 72. The unreacted organic from line 70 and the organic remains on the tube side from line 72 are recovered by further processing steps down the line from the reactor vessel 20 which are well known to those skilled in the art.

Once the desired carbon coating of the membrane 22 is achieved, the liquid ethylbenzene feed source is terminated. At this time, only nitrogen gas is introduced into the tube side of the ceramic membrane 22. This acts to purge the ceramic membrane 22 of ethylbenzene and water. After purging, the furnace is ramped upwardly from 640° C. to about 700° C. to 1000° C. with about 750° C. to 850° C. being preferred while still maintaining the nitrogen gas flow. The furnace is maintained at this temperature for about 0.5 to 2 hours with 1 to 1½ hours being preferred. This step acts to take the carbon deposited in the deposition stage and pyrolize or carbonize the coating.

It will be appreciated that other hydrocarbons can be used to coat the ceramic membrane. In another embodiment of the method of the invention, gas phase propylene is introduced directly into a stainless steel vessel containing a ceramic membrane. The carbon coated ceramic membrane produced by using vaporized propylene has a ceramic membrane exposure time of about 1 to 5 hours with about 2 to 4 hours being most preferred. The ceramic membrane exposure temperature is about 350° C. to 650° C. with about 400° C. to 600° C. being preferred.

The gas phase propylene is fed into the tube side of the ceramic membrane to be coated while at the same time, a nitrogen gas purge is fed to the vessel side surrounding the outside of the ceramic membrane tube to be coated. After a period of time these flows are reversed so that the vapor phase propylene is fed to the vessel side of the ceramic membrane and the nitrogen gas flow is fed into the tube side of the ceramic membrane. This is followed by a post treatment of nitrogen gas purging, similar to that disclosed above.

Experimental Results—Uncoated Ceramic Membrane

Two primary tools for characterizing ceramic membranes are (i) $N_2$ gas permeation and (ii) pore size distribution analysis. Performance of ceramic membranes involve a trade off between (i) the rate gas can flow through the membrane (permeability) and (ii) the ability to separate gases of different size or molecular weight, which relates to pore size distribution. As pore size decreases the ceramic membrane becomes more selective to differences in molecular size or molecular weight, but permeability also decreases because the gas must flow through smaller pores. Permeability is measured in units of $m^3/(m^2\text{-hr-atm})$ for nitrogen gas permeation at 25° C. This unit of measurement measures the volume of gas in $m^3$ that permeates through an area of the tube (measured in $m^2$) per hour (hr) per atmosphere of transmembrane pressure (atm). This is a standard measurement for permeability well known to those skilled in the art.

Figure 3:
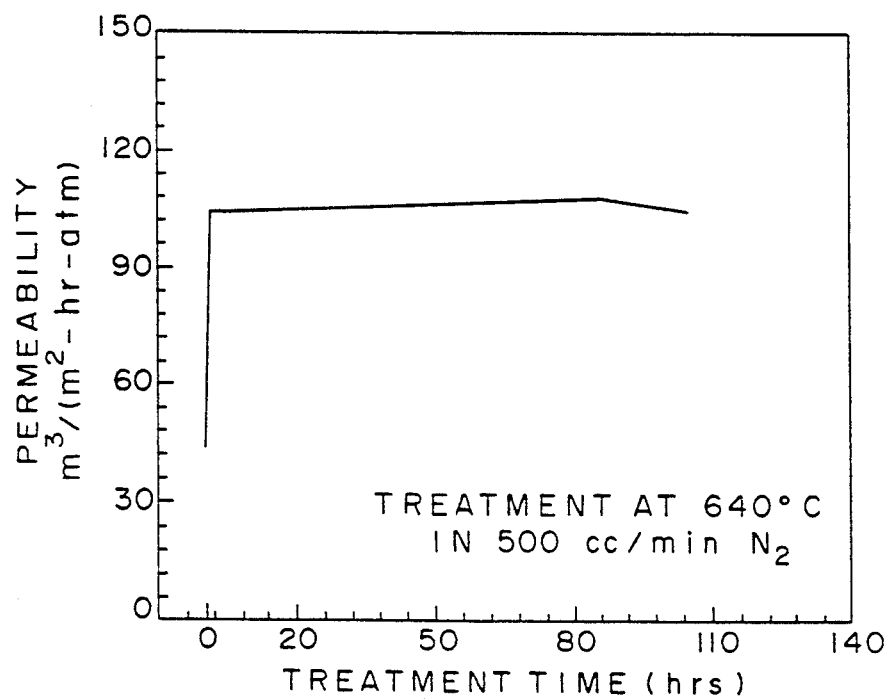
FIG. 3 is a graph showing the effect on permeability over time of an uncoated ceramic membrane undergoing thermal treatment at 640° C.
Figure 4:
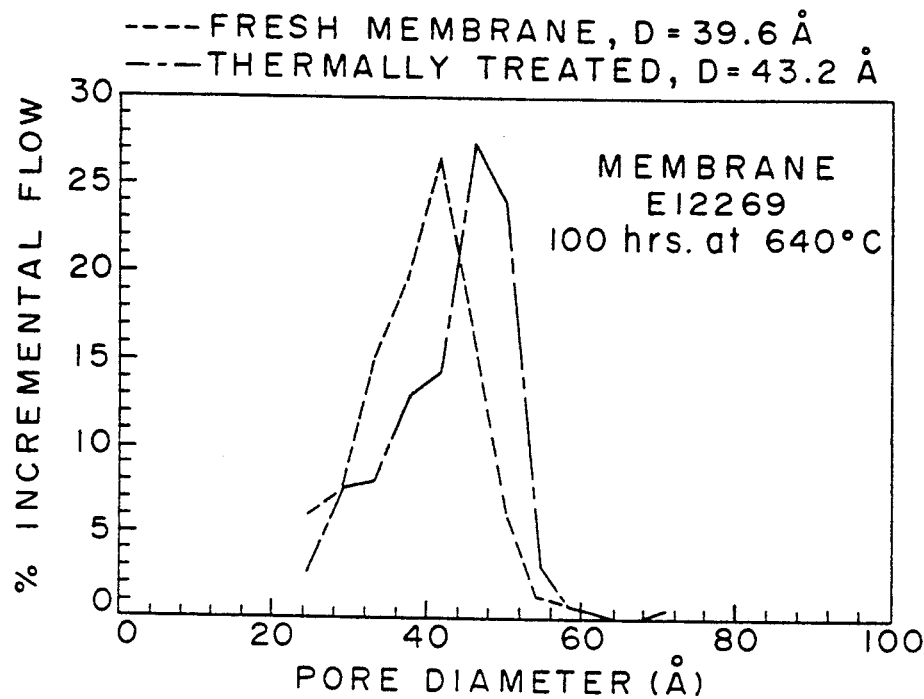
FIG. 4 is a graph showing the pore size distribution of an uncoated ceramic membrane that has undergone thermal treatment.

The effect of thermal treatment on fresh uncoated ceramic membranes is shown in FIGS. 3 and 4. FIG. 3 shows a fresh ceramic membrane that was treated in 500 cc/min of nitrogen gas at a temperature of 640° C. over a time period of 140 hours. This experiment involved a single ceramic membrane and its purpose was to determine if there were any long term effects of high temperature on the characteristics of the membrane. As can be seen, permeability rises sharply to about double the initial value after one hour but remains nearly constant thereafter. The increase in permeability upon thermal treatment suggests either an enlargement in the pore size of existing pores and/or an increase in the number of open pores (porosity). The pore size distribution results indicate an increase in porosity.

FIG. 4 shows a pore size distribution comparison of a fresh membrane and a membrane treated for 100 hours at 640° C. The X-axis indicates the pore diameter and the Y-axis is the percentage of incremental flow. In this procedure, the ceramic membrane is initially filled with a condensed vapor such that no gas flow can get through the ceramic membrane, i.e., 0% incremental flow. As the system pressure decreases, pores in the ceramic membrane are evacuated. As the pores are evacuated, flow incrementally increases. The evacuation takes place in steps with the larger pores being evacuated before the smaller pores. The system pressure for each step can be used to calculate a pore size based on the Kelvin equation. This is a standard procedure well known to those skilled in the art for measuring permeability. Only slight pore enlargement is shown after thermal treatment.

Figure 5:
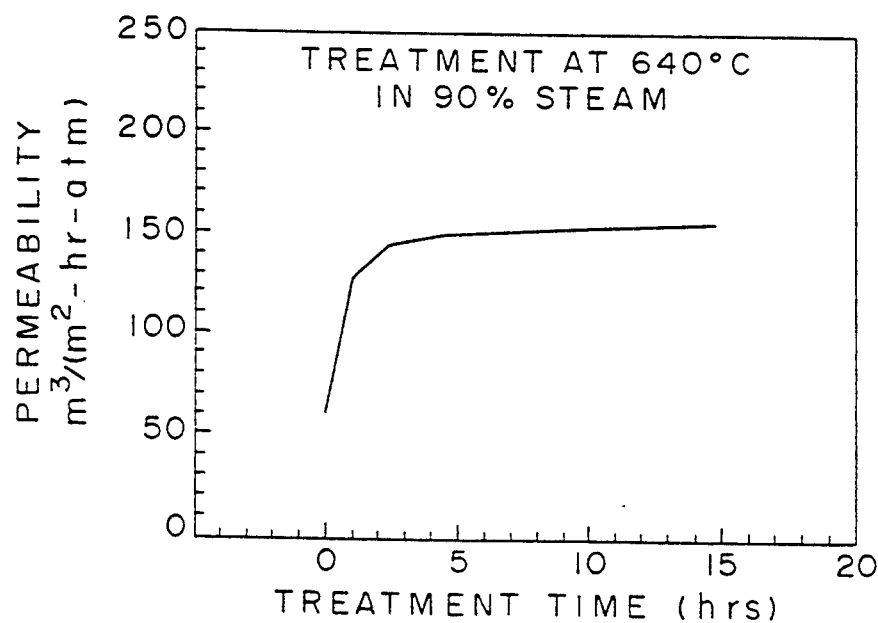
FIG. 5 is a graph showing the effect on permeability of an uncoated membrane undergoing hydrothermal treatment.
Figure 6:
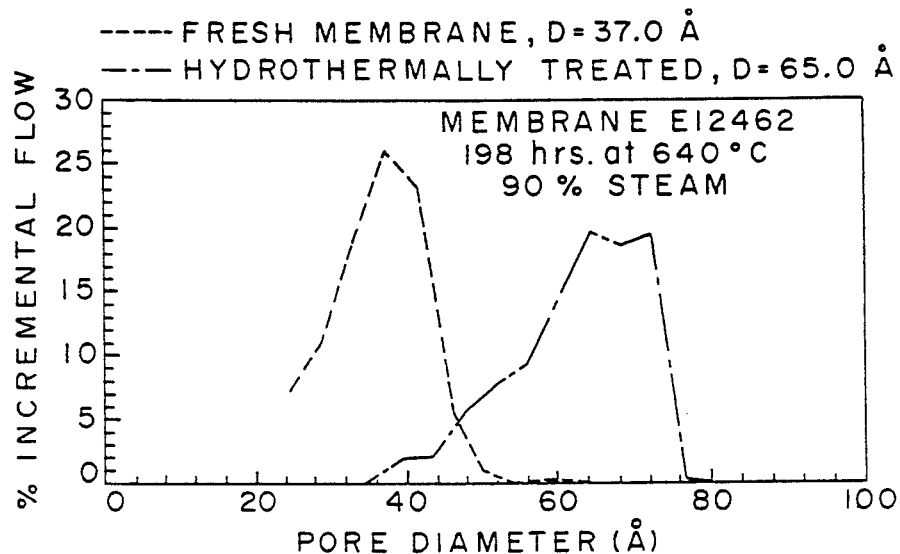
FIG. 6 is a graph showing the pore size distribution of an uncoated ceramic membrane that has undergone hydrothermal treatment as compared to the pore size distribution of an uncoated ceramic membrane that has not undergone hydrothermal treatment.

The effect of exposure of an uncoated membrane to hydrothermal conditions is summarized in FIGS. 5 and 6 and Table I. This hydrothermal exposure consisted of treatment at 640° C. in a stream of 80–90% steam (typically 1.5–2.5 liquid ml/min of water vaporized into 200–500 cc/min $N_2$). FIG. 5 shows the increase in permeability for a membrane treated for approximately 15 hours. As can be seen, the permeability rises sharply in the first two hours of treatment before plateauing at a value of approximately 155 $m^3/(m^2\text{-hr-atm})$. This value exceeds the value of about 120 $m^3/(m^2\text{-hr-atm})$ observed after thermal treatment alone. Table I includes the permeability vs. hydrothermal treatment results for this membrane and a second membrane which was hydrothermally treated for 198 hours.

TABLE I

| Membrane | Treatment Time (hr) | $N_2$ Permeability $m^3/(m^2\text{-hr-atm})$ | |
|---|---|---|---|
| | | Fresh | Treated |
| 1 | 15 | 70 | 155 |
| 2 | 198 | 50 | 188 |

The final permeability of this second membrane was 188 $m^3/(m^2\text{-hr-atm})$. The difference in final permeability for the two membranes with different treatment times probably reflects experimental variation but may also include some effect due to longer treatment time. The pore size distribution in FIG. 6 is shown before and after hydrothermal treatment of a ceramic membrane for 198 hours at 640° C. In contrast to the thermal results reported above, hydrothermal treatment results in an increase in pore size from an average of approximately 40 Å to about 65 Å. Part of the increase in permeability is due to an opening of the pores as with the thermal treatment only. The increase in permeability above the 120 $m^3/(m^2\text{-hr-atm})$ value observed during thermal treatment can be directly related to an increase in pore size:

$$(120 \; m^3/(m^2\text{-hr-atm}) \times 65 \; \text{Å}/40 \; \text{Å} = 195 \; m^3/(m^2\text{-hr-atm})$$

Experimental Results—Carbon Coated Membrane

Ceramic membranes which were coated with carbon by the method of the invention involving vaporized ethylbenzene were tested for permeability and pore size distribution. Table II shows that carbon coating results in a decline in permeability from between 42 and 55 $m^3/(m^2\text{-hr-atm})$ to between 4 and 20 $m^3/(m^2\text{-hr-atm})$.

TABLE II

| Membrane | $N_2$ Permeability $m^3/(m^2\text{-hr-atm})$ | |
|---|---|---|
| | Fresh | Coated |
| 1 | 45 | 20 |
| 2 | 45 | 8 |
| 3 | 42 | 9 |
| 4 | 42 | 4 |
| 5 | 55 | 11 |

Figure 7:
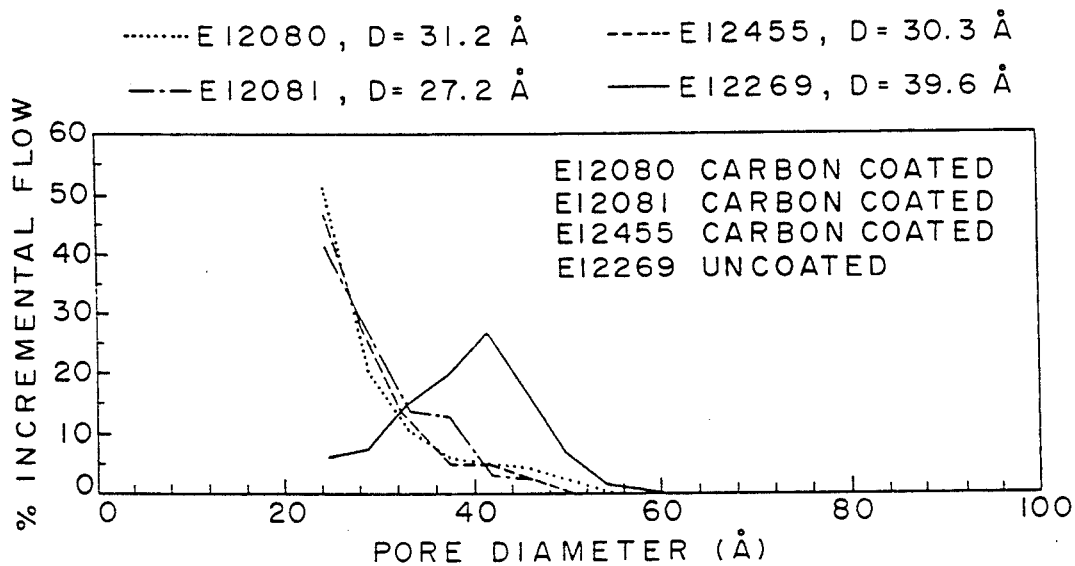
FIG. 7 is a graph showing the pore size distribution comparison of an uncoated ceramic membrane versus three coated ceramic membranes.

FIG. 7 shows the pore size distribution of several membranes that underwent carbon coating compared to a fresh uncoated membrane. It can be seen that carbon coating results in narrowing the pores of the ceramic membrane from 40 Å to less than 30 Å. The observed changes are consistent with a partial blockage of the pore structure along with a narrowing of the pores that remain open.

Figure 8:
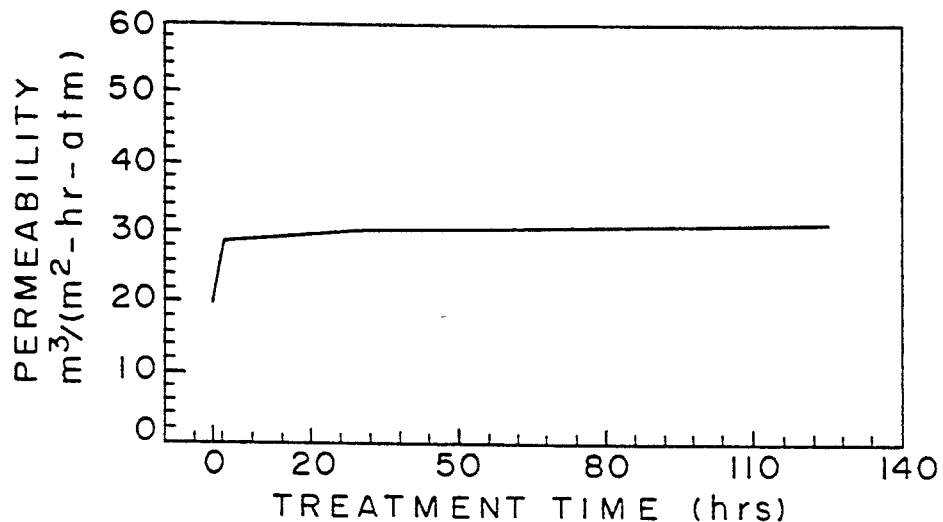
FIG. 8 is a graph showing the effect on permeability of a coated ceramic membrane undergoing thermal treatment at 640° C.
Figure 9:
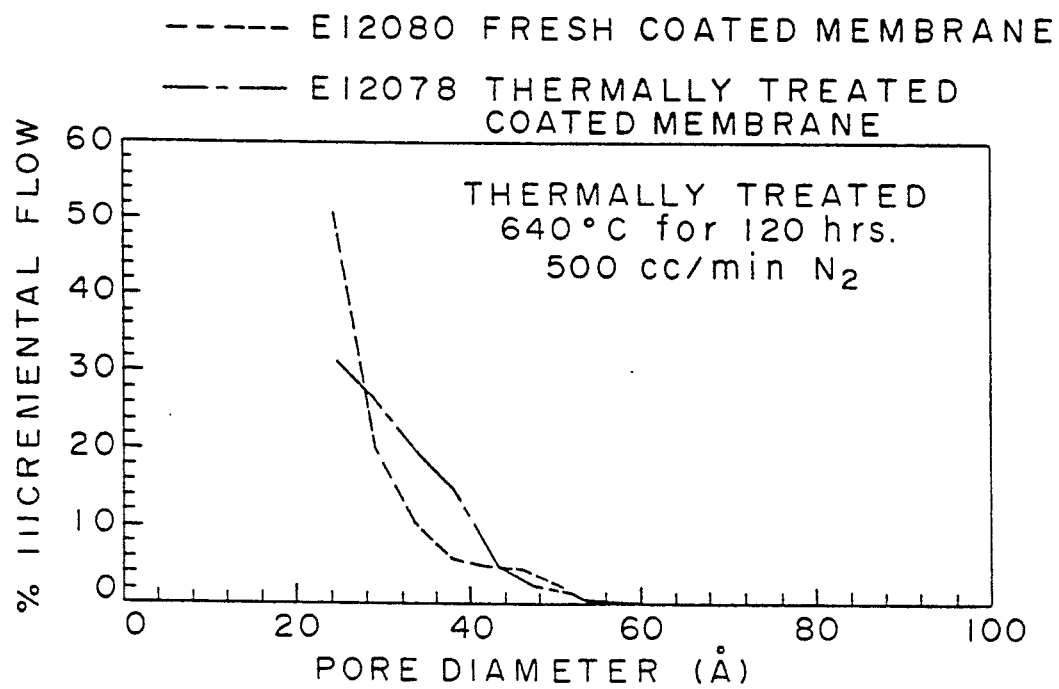
FIG. 9 is a graph showing the pore size distribution of a coated ceramic membrane that has undergone thermal treatment at 640° C.

The impact of thermal treatment on the carbon coated membrane is shown in FIGS. 8 and 9. A membrane, with an as-received permeability of about 45 $m^3/(m^2\text{-hr-atm})$, had a permeability of about 20 $m^3/(m^2\text{-hr-atm})$ after carbon coating. When subjected to a 500 cc/min flow of $N_2$ at 640° C., as shown in FIG. 8 the permeability rose immediately and leveled out at a value of about 30 $m^3/(m^2\text{-hr-atm})$. No further increase in permeability was observed for treatment up to 120 hours. FIG. 9 compares the pore size distribution of the thermally treated carbon coated membrane with that of a freshly coked membrane. No significant change in pore size distribution occurred with thermal treatment.

Figure 10:
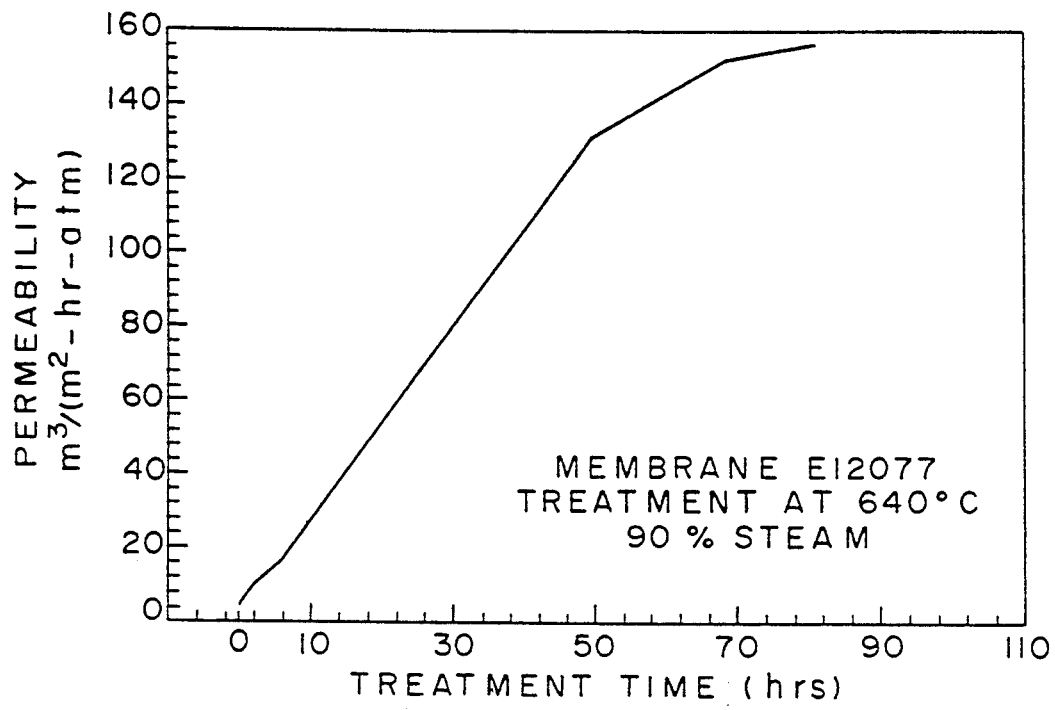
FIG. 10 is a graph showing the effect on permeability of a coated ceramic membrane undergoing hydrothermal treatment.
Figure 11:
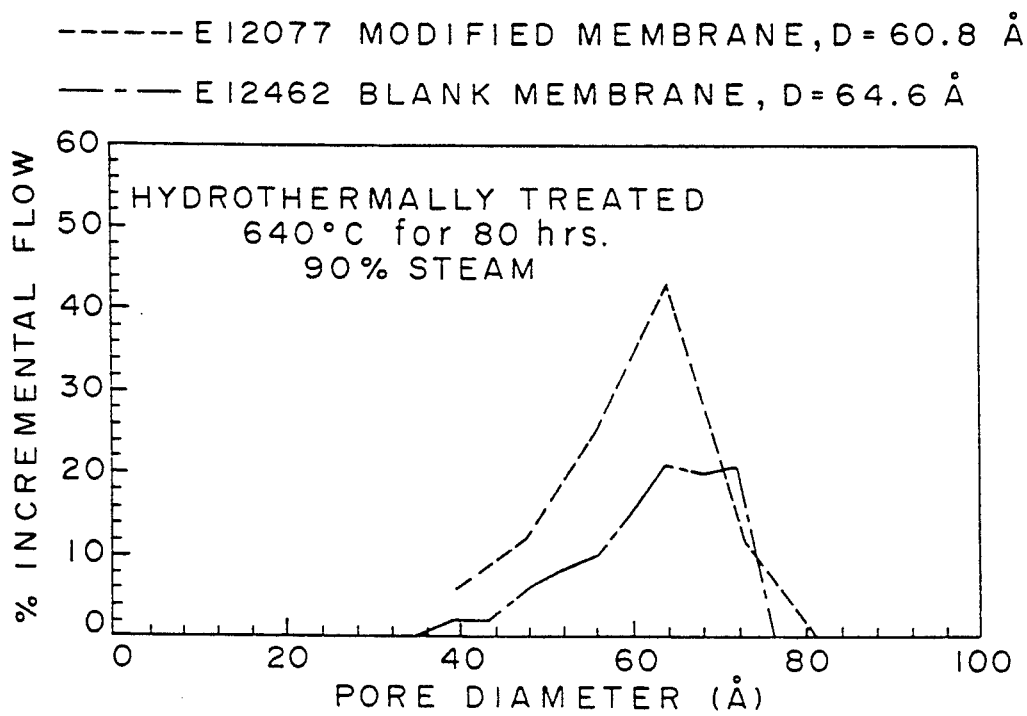
FIG. 11 is a graph showing the pore size distribution of a coated versus an uncoated ceramic membrane upon both undergoing hydrothermal treatment.

Hydrothermal treatment effects on the carbon coated membrane are summarized in FIGS. 10 and 11. From FIG. 10, the permeability of the membrane fell from about 50 to 5 $m^3/(m^2\text{-hr-atm})$ upon carbon coating. Exposure to 90% steam at 640° C. led to a gradual increase in permeability. After 80 hours of exposure, the permeability levelled at 150 $m^3/(m^2\text{-hr-atm})$. This is the same permeability value that was observed for the blank membrane after hydrothermal treating. However, in the case of the blank membrane, this permeability was attained after 2 hours of treatment while for the carbon coated membrane, this value was attained gradually and only after 80 hours of treatment. FIG. 11 shows the pore size distribution of the carbon coated membrane after hydrothermal treatment. Also shown is the pore size distribution of the hydrothermally treated blank membrane. The hydrothermal treatment of the carbon coated membrane resulted in the average pore size to a value of approximately 61 Å. This is comparable to the 65 Å value observed for the blank membrane.

The conclusion is that the carbon layer acts as a barrier to the effects of steam on the gamma alumina layer of the membrane. Under hydrothermal conditions, this barrier is slowly reacted away, exposing the underlying gamma alumina, which then undergoes its characteristic transition.

As was discussed above, an alternate method to ethylbenzene treatment was carbon coating with propylene. For 0.2 micron and 0.8 micron membranes (containing no gamma alumina) no notable change in permeability was observed after carbon coating. For a 40 Å membrane (containing a gamma alumina layer) with an initial permeability of 67 $m^3/(m^2\text{-hr-atm})$, exposure to propylene at 400° C. for 2 hours followed by post treatment in $N_2$ for 1 hour at 800° C. resulted in a permeability increase to 90 $m^3/(m^2\text{-hr-atm})$. Another membrane with an initial permeability of 55 $m^3/(m^2\text{-hr-atm})$ had a final permeability of 81 $m^3/(m^2\text{-hr-atm})$ after treatment in propylene at 500° C. for 2 hours. However, a membrane exposed to propylene on the tube side for 2 hours at 400° C. followed by exposure on the shell side at 600° C. for 2 hours had its permeability fall from 51 $m^3/(m^2\text{-hr-atm})$ to 2 $m^3/(m^2\text{-hr-atm})$ Another important property of ceramic membranes is their ability to withstand chemical attack. In order to test chemical stability, various membranes were exposed to a 2% HCl solution (pH=0.5) for 24 hours at room temperature followed by exposure to a 2% HCl solution (pH=0.5) at 70° C. for 2 hours. The results are summarized in Tables III and IV.

TABLE III

| Membrane | Permeability $m^3/(m^2\text{-hr-atm})$ | | |
|---|---|---|---|
| | Fresh | Coated | Acid Treated |
| 40 Å Blank | 76 | N/A | 143 |
| 0.2 μm Blank | 1076 | N/A | 1138 |
| 0.8 μm Blank | 2856 | N/A | 2956 |
| 40 Å Propane Coated | 51 | 2 | 2 |
| 40 Å EB Coated | 60 | 4 | 27 |

TABLE IV

| Membrane | $[Al^{+3}]$ (mg/L) |
|---|---|
| 40 Å Blank | 17.9 |
| 0.2 μm Blank | 2.4 |
| 0.8 μm Blank | 4.4 |
| 40 Å Propane Coated | 5.6 |

TABLE IV-continued

| Membrane | $[Al^{+3}]$ (mg/L) |
|---|---|
| 40 Å EB Coated | 7.6 |
| HCl Solution | 0.4 |

From Table III, no effect of acid treatment on permeability for 0.2 micron and 0.8 micron membranes was observed. This was expected since these membranes consist entirely of alpha alumina which is inert to acids and bases. The blank 40 Å membrane consists of acid unstable gamma alumina on an alpha alumina support. Acid treatment of this membrane resulted in an increase in $N_2$ permeability from 76 $m^3/(m^2\text{-hr-atm})$ to 143 $m^3/(m^2\text{-hr-atm})$. For the propylene coated membrane, acid treatment had no impact on permeability. The permeability of the acid treated membrane was the same 2 $m^3/(m^2\text{-hr-atm})$ as that of the freshly coked membrane. Also shown are the results for a 40 Å membrane coated with ethylbenzene. Here the permeability increased from 4 $m^3/(m^2\text{-hr-atm})$ to 27 $m^3/(m^2\text{-hr-atm})$.

Shown in Table IV are Al atomic absorption analysis results of the acid soak solutions after being used to treat the various membranes. The concentration of the fresh solution was 0.4 mg $Al^{+3}$/solution. Levels for the blank 0.2 micron and 0.8 micron membranes were 2.4 and 4.4 mg/L respectively. Although these alpha alumina membranes should be inert to acids, some remnant soluble alumina from membrane preparation may account for this increase. The result for the blank gamma alumina membrane shows a substantial increase to 17.9 mg/L. This is in line with the known poor acid stability of gamma alumina. The concentration of Al+ in the solution used to treat the propylene coked membrane was 5.6 mg/L, only slightly higher than that observed for the alpha alumina based membranes. The level was slightly higher at 7.6 mg/L for the membrane coked with ethylbenzene.

These results suggest that the carbon layers are effective barriers against acid attack. The difference between the results for propylene and ethylbenzene treated membranes may indicate a more uniform layer from propylene deposition.

It will be appreciated that the surface properties of the carbon coated membrane will be modified relative to an uncoated ceramic membrane. Those surface properties include polarity, hydrophobicity, acidity and bascidity.

It will be appreciated that the present invention has provided a method of producing a carbon coated ceramic membrane of reduced pore size and modified surface properties having increased chemical, thermal and hydrothermal stability over a non-coated ceramic membrane.

Whereas a particular embodiment of the invention has been described above, for purposes of illustration, it will be evident to those skilled in the art that numerous variations of the details may be made without departing from the invention as defined in the appended claims.

What is claimed is:

1. A method of producing a carbon coated ceramic membrane comprising:
    passing a selected hydrocarbon vapor through a ceramic membrane and controlling ceramic membrane exposure temperature and ceramic membrane exposure time, said ceramic membrane exposure temperature being at least 350° C. and said ceramic membrane exposure time depending on said ceramic membrane exposure temperature, to form a carbon coated ceramic membrane of reduced pore size and modified surface properties having increased chemical, thermal and hydrothermal stability over an uncoated ceramic membrane.

2. The method of claim 1, wherein
said selected hydrocarbon is ethylbenzene.

3. The method of claim 2, wherein
said ceramic membrane exposure time is 1 to 5 hours.

4. The method of claim 3, wherein
said ceramic membrane exposure temperature is 575° C. to 675° C.

5. The method of claim 4, wherein
said ceramic membrane exposure time is 3½ to 4½ hours and said ceramic membrane exposure temperature is 630° C. to 650° C.

6. The method of claim 1, wherein
said selected hydrocarbon is propylene.

7. The method of claim 6, wherein
said ceramic membrane exposure time is 1 to 5 hours.

8. The method of claim 7, wherein
said ceramic membrane exposure temperature is 350° C. to 650° C.

9. The method of claim 8, wherein
said ceramic membrane exposure time is 2 to 4 hours and said ceramic membrane exposure temperature is 400° C. to 600° C.

10. The method of claim 1, including
pretreating to clean said ceramic membrane by passing an inert gas through said ceramic membrane, which has been heated to at least 400° C., to purge desorbing gases.

11. The method of claim 10, wherein
said elevated temperature is 400° C. to said ceramic membrane exposure temperature.

12. The method of claim 1, including
pretreating to modify surface chemistry and composition of said ceramic membrane to promote carbon deposition.

13. The method of claim 12, wherein
said pretreating step modifies acidity of said ceramic membrane.

14. The method of claim 13, wherein
said pretreating step promotes deposition of catalytic material.

15. The method of claim 1, including
after passing a hydrocarbon containing vapor through said ceramic membrane, subsequently heating said ceramic membrane to a carbon coating exposure temperature of 700° C. to 1000° C.

16. The method of claim 15, wherein
said carbon coating exposure temperature is 750° C. to 850° C.

17. The method of claim 1, including
providing said ceramic membrane having a tube shape with a first open end and a second open end.

* * * * *